US010578964B2

(12) United States Patent
Ganapathisubramanian et al.

(10) Patent No.: US 10,578,964 B2
(45) Date of Patent: Mar. 3, 2020

(54) ASYMMETRIC TEMPLATE SHAPE MODULATION FOR PARTIAL FIELD IMPRINTING

(71) Applicant: Canon Nanotechnologies, Inc., Austin, TX (US)

(72) Inventors: Mahadevan Ganapathisubramanian, Cupertino, CA (US); Matthew M. Kincaid, Austin, TX (US); Byung-Jin Choi, Austin, TX (US); Sidlgata V. Sreenivasan, Austin, TX (US)

(73) Assignee: Canon Nanotechnologies, Inc., Austin, TX (US)

( * ) Notice: Subject to any disclaimer, the term of this patent is extended or adjusted under 35 U.S.C. 154(b) by 779 days.

(21) Appl. No.: 14/587,370

(22) Filed: Dec. 31, 2014

(65) Prior Publication Data

US 2015/0183151 A1    Jul. 2, 2015

Related U.S. Application Data

(60) Provisional application No. 61/922,431, filed on Dec. 31, 2013.

(51) Int. Cl.
*B29C 59/00* (2006.01)
*G03F 7/00* (2006.01)

(52) U.S. Cl.
CPC ................ *G03F 7/0002* (2013.01)

(58) Field of Classification Search
None
See application file for complete search history.

(56) References Cited

U.S. PATENT DOCUMENTS

| | | | |
|---|---|---|---|
| 5,151,277 A | * | 9/1992 | Bernardon ............ B29C 33/302 249/155 |
| 5,464,337 A | * | 11/1995 | Bernardon ............ B29C 33/302 264/257 |
| 6,873,087 B1 | | 3/2005 | Choi et al. |
| 6,932,934 B2 | | 8/2005 | Choi et al. |
| 6,936,194 B2 | | 8/2005 | Watts |
| 7,037,458 B2 | * | 5/2006 | Ford ...................... B29C 59/02 264/293 |
| 7,077,992 B2 | | 7/2006 | Sreenivasan et al. |
| 7,157,036 B2 | | 1/2007 | Choi et al. |
| 7,179,396 B2 | | 2/2007 | Sreenivasan |
| 7,396,475 B2 | | 7/2008 | Sreenivasan |
| 8,076,386 B2 | | 12/2011 | Xu et al. |

(Continued)

FOREIGN PATENT DOCUMENTS

| | | |
|---|---|---|
| JP | 2013131577 | 3/2010 |
| JP | 2012-134214 | 7/2012 |

(Continued)

OTHER PUBLICATIONS

JP 2012-134214 Machine-generated translation, provided to Applicant by Intellectual Property Office of Singapore, Jul. 11, 2017.

*Primary Examiner* — Matthew J Daniels
*Assistant Examiner* — Mohammad M Ameen
(74) *Attorney, Agent, or Firm* — Cameron A. King

(57) ABSTRACT

Systems and methods for partial field imprinting are provided such that imprint templates are asymmetrically modulated to allow initial contact with a partial field on a substrate at a location spaced apart from the template center.

6 Claims, 6 Drawing Sheets

(56) References Cited

U.S. PATENT DOCUMENTS

| | | |
|---|---|---|
| 8,349,241 B2 | 1/2013 | Sreenivasan et al. |
| 8,556,616 B2 | 10/2013 | Resnick et al. |
| 8,916,230 B2 | 12/2014 | Ganapathisubramanian et al. |
| 2004/0065252 A1 | 4/2004 | Sreenivasan et al. |
| 2006/0005657 A1* | 1/2006 | Choi ................... B29C 43/021 74/490.07 |
| 2007/0231422 A1* | 10/2007 | Cherala ................ B82Y 10/00 425/453 |
| 2008/0160129 A1* | 7/2008 | Resnick ................ B82Y 10/00 425/385 |
| 2008/0251975 A1* | 10/2008 | Gallagher ........... B29C 33/0011 264/571 |
| 2008/0278702 A1* | 11/2008 | Van Der Pasch ... G03F 7/70516 355/53 |
| 2009/0283934 A1 | 11/2009 | Sreenivasan |
| 2010/0059914 A1 | 3/2010 | Cherala et al. |
| 2011/0171340 A1 | 7/2011 | Resnick et al. |
| 2013/0056905 A1 | 3/2013 | Hamaya et al. |
| 2013/0300031 A1 | 11/2013 | Torii et al. |

FOREIGN PATENT DOCUMENTS

| | | |
|---|---|---|
| KR | 10-2012-003955 | 4/2012 |
| WO | WO 2013/0214641 | 2/2013 |

* cited by examiner

ASYMMETRIC TEMPLATE SHAPE MODULATION FOR PARTIAL FIELD IMPRINTING

CROSS-REFERENCE TO RELATED APPLICATION

This application claims the benefit under 35 U.S.C. § 119(e)(1) of U.S. Provisional Application No. 61/922,431 filed Dec. 31, 2013; which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Pat. No. 8,349,241, U.S. Patent Publication No. 2004/0065252, and U.S. Pat. No. 6,936,194, all of which are hereby incorporated by reference herein.

An imprint lithography technique disclosed in each of the aforementioned U.S. patent publication and patents includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
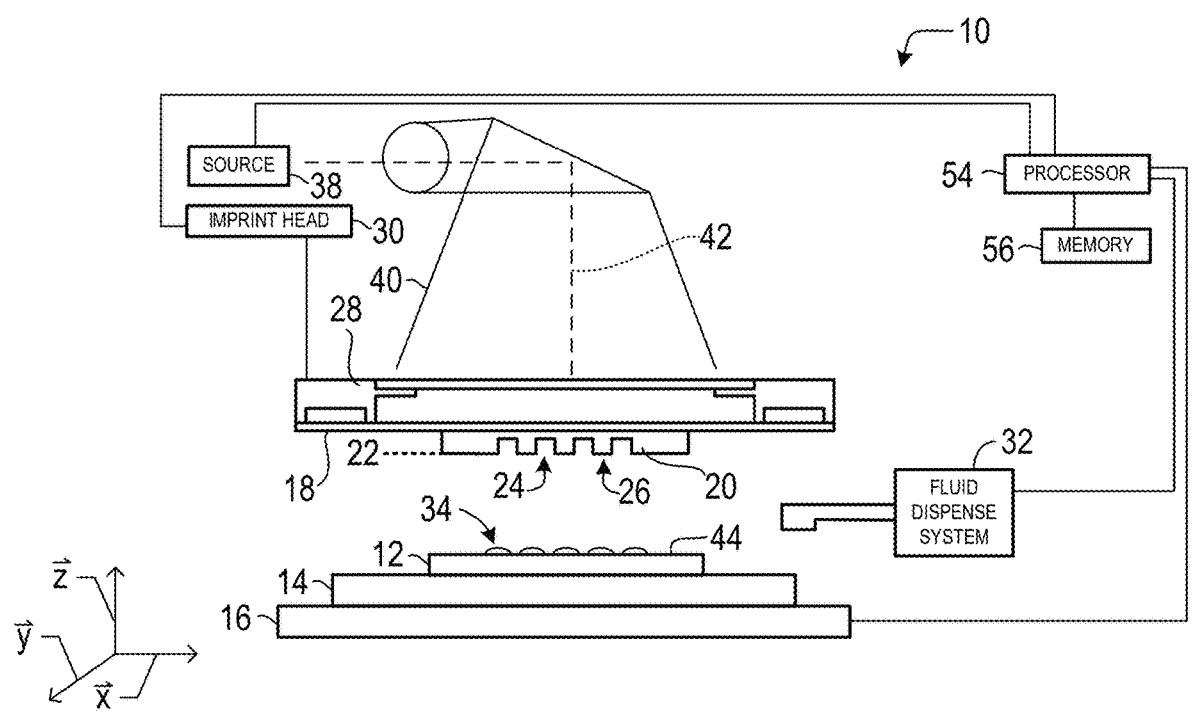
FIG. 1 illustrates a simplified side view of a lithographic system having a template and a mold spaced apart from a substrate.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Patent Publication No. 2005/0187339, both of which are herein incorporated by reference. Alternatively, formable material 34 may include, but is not limited to, biomaterials (e.g., PEG), solar cell materials (e.g., N-type, P-type materials), and/or the like.

Figure 2:
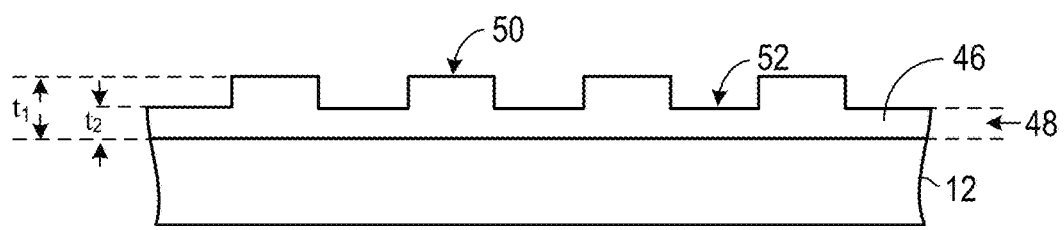
FIG. 2 illustrates a simplified view of the substrate illustrated in FIG. 1, having a patterned layer thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. Nos. 6,932,934, 7,077,992, 7,179,396, and 7,396,475, all of which are hereby incorporated by reference in their entirety.

Figure 3:
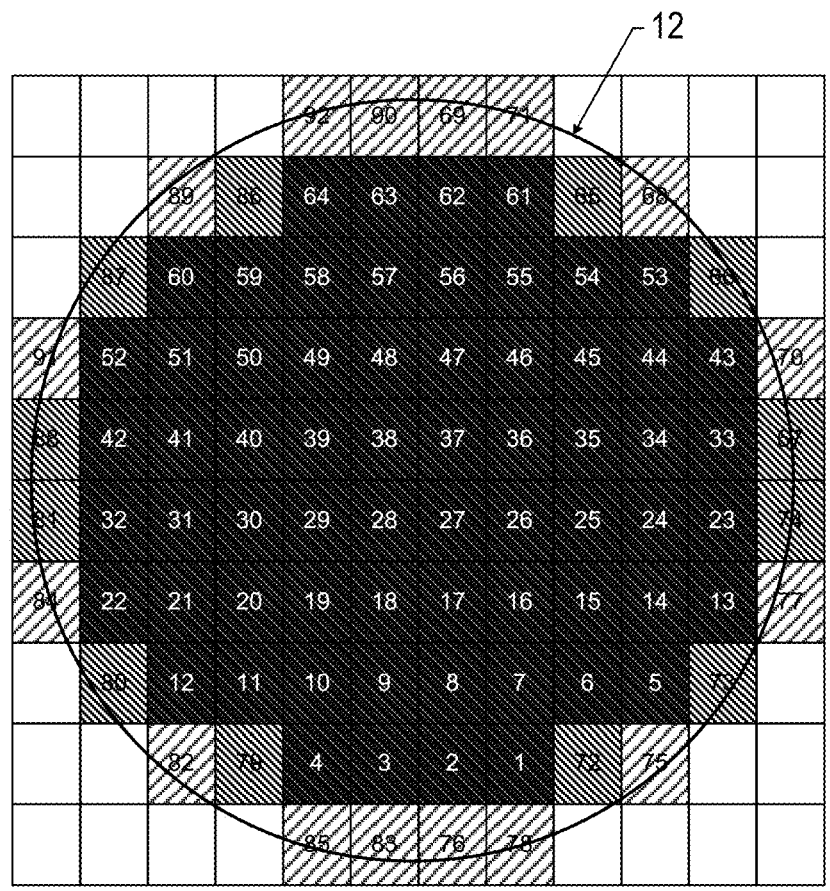
FIG. 3 illustrates a typical field layout on a standard silicon wafer substrate, including full fields and partial fields.

The present invention incorporates aspects and elements of the above-mentioned systems and processes, as will be apparent to those skilled in the art in view of this description, and in particular provides for systems and methods of imprinting partial fields on a substrate. Partial fields are of particular interest in the semiconductor industry, in which typical substrates are 300 mm diameter silicon wafers. Partial fields in general refers to imprint fields typically at or near the wafer edge that consist of less than the full area that could otherwise be imprinted by the entire patterning surface (i.e., imprint field) of the subject imprint template. It is desirable to imprint such partial fields in order to maximize the percentage of a wafer that can yield semiconductor devices. Partial fields can be classified into two further sub-categories based on the area of the imprint field that overlaps the wafer, namely, (i) fields with more than 50% area coverage (>50%), and (ii) fields with less than 50% area coverage (<50%). Referring to FIG. 3, there is shown a wafer having full fields (fields 1-64), >50% partial fields (fields 65-67, 72-74, 79-81, and 86-88), and <50% partial fields (fields 68-71, 76-78, 82-85, 89-92). Imprinting on partial fields poses a unique challenge in that sub-portions of the patterning surface (i.e., imprint field) on the template are positioned into close proximity with the wafer without the presence of formable material (i.e., imprint fluid) being entirely present between the template and the wafer.

The present invention incorporates aspects and elements of the above-mentioned systems and processes, as will be apparent to those skilled in the art in view of this description, and in particular provides for systems and methods of imprinting partial fields on a substrate by asymmetrically modulating the shape of the template relative to the center of the template. This asymmetrical template modulation aids in avoiding contact between the template and the edge of the substrate or any region of the substrate where the formable material has not been deposited or otherwise established. This is important not only to avoid template damage and maximize template life, but also to minimize defects in the imprinted partial field and subsequently imprinted fields, including further partial field and/or full fields internal to the substrate. It will be appreciated that references herein to systems and methods of partial field imprinting of wafers are merely exemplary, and that such systems and methods are also applicable in imprinting other types, sizes and shapes of substrates and for other industries.

Modulating imprint templates into a convex shape for improved imprint fluid filling during imprinting processes has been described, for example, in U.S. Patent Publication No. U.S. 2008/0160129, incorporated herein by reference in its entirety. However, using such an approach for imprinting partial fields, in particular partial fields with less than 50% (<50%) coverage can result in the lowest point of deflection of the template being at a location beyond the edge the wafer. This, in turn, can result in a portion of the template physically touching the edge of the wafer first before other portions of the imprint field come in contact with imprint fluid deposited on the wafer surface. As previously noted, this can lead to template damage and/or the creation of defects in subsequently imprinted fields. Additional constraints arise in partial field imprinting due to the fact that, in the absence of any physical boundaries to control the spreading of the imprint fluid, it is typically desirable to limit the deposition of imprint fluid to approximately 1 mm from the wafer edge. Depositing imprint fluid all the way up to the wafer edge can result in extrusion of imprint material beyond the desired imprint area of the partial field, resulting in residual material, or extrusions, collecting on the template which can cause defects in subsequent full field imprints. However, restricting the deposition of imprint fluid in this manner leaves the edge portions of the wafer without imprint fluid. Thus if any portions of the imprint field come into such direct contact with the wafer edge, or edge portions without imprint fluid, there is potential risk of permanent damage to the template.

Figure 4A:
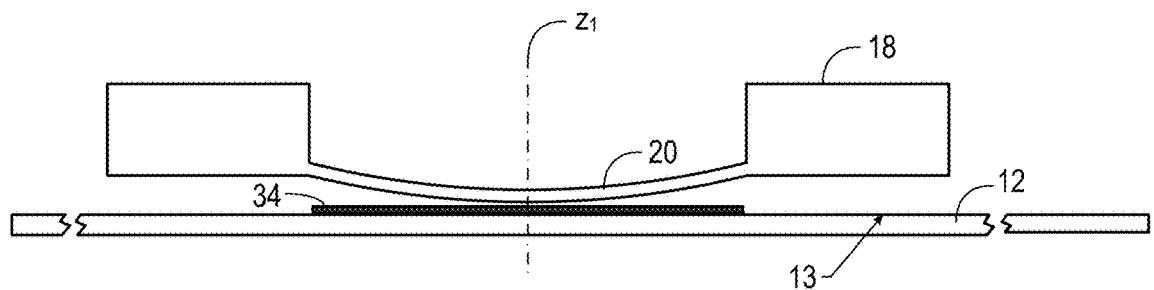
FIG. 4A illustrates a simplified cross-sectional view of an imprint lithography template symmetrically bowed toward a substrate at a full field location.
Figure 4B:
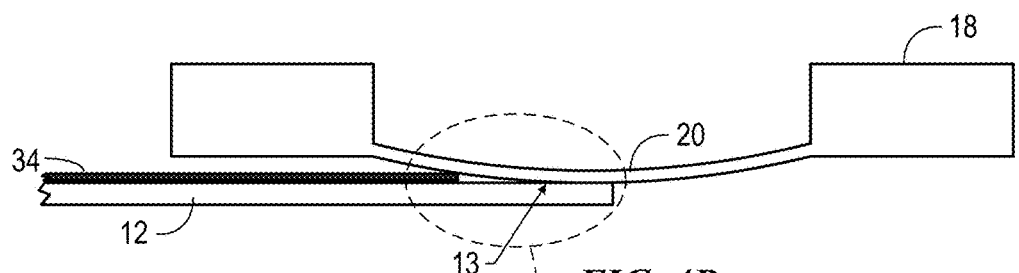
FIG. 4B illustrates a simplified cross-sectional view of a template symmetrically bowed toward a substrate at a partial field location.
Figure 4C:
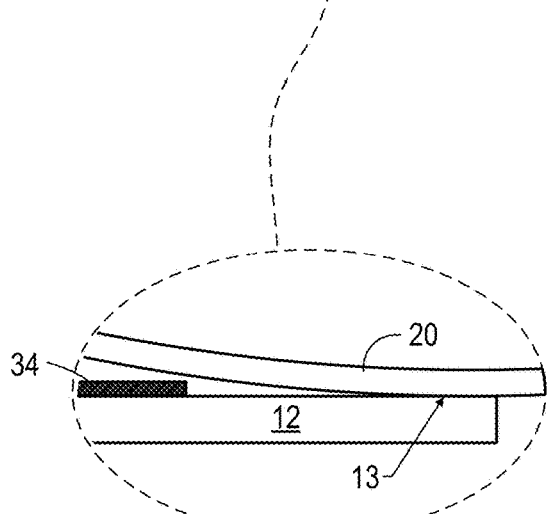
FIG. 4C illustrates an expanded view of the template and substrate of FIG. 4B.

Referring to FIG. 4A, when imprinting full fields on wafer 12, template 18 (held by a template chuck, not shown) may be symmetrically bowed toward wafer 12, so as to present a convex surface to the imprint fluid droplets 34 which provides for efficient spreading of the drops. As can be seen from FIG. 4A, with such symmetrical bowing, the lowest point of deflection of template 18 is along central axis $z_1$. However, for partial field imprinting, and in particular partial field imprinting of less than 50% of full field area (<50%), such symmetrical bowing of the template 18 toward wafer 12 can cause template 18 to contact wafer edge 13, as depicted in FIGS. 4B-4C.

Figure 5:
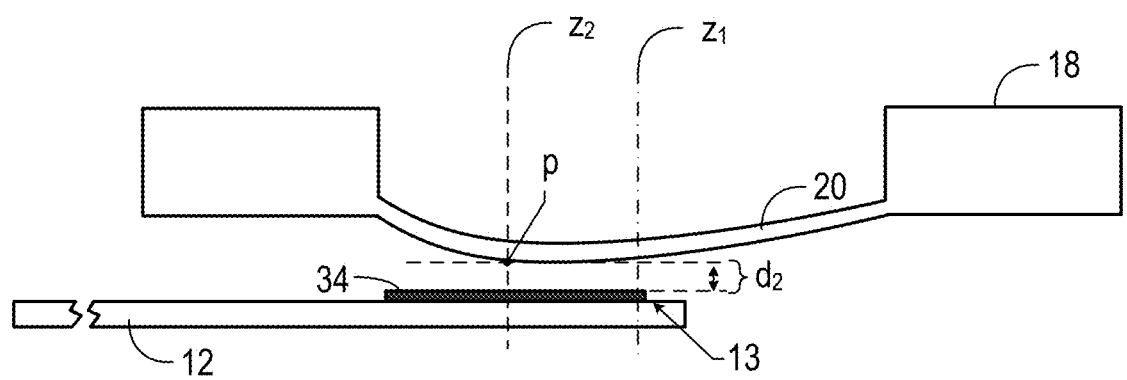
FIG. 5 illustrates a simplified cross-sectional view of a template asymmetrically bowed toward a substrate at a partial field location according to an embodiment of the invention.

Referring now to FIG. 5, an exemplary method of the invention is depicted for imprinting partial fields. As shown, template 18 (likewise held by a template chuck, not shown) is in superimposition within the partial field being imprinted and is asymmetrically flexed toward the wafer such that maximum or lowest deflection point p of template 18 is located along axis $z_2$ which is parallel to, but spaced apart from, the center axis $z_1$ of template 18 and the template chuck (not shown). This movement of lowest deflection point p away from center axis $z_1$ ensures that as template 18 is lowered into contact with wafer 12, the initial contact of template 18 will be with imprint fluid 34 positioned in the partial field, while avoiding undesirable contact of the template with wafer edge 13.

Figure 6:
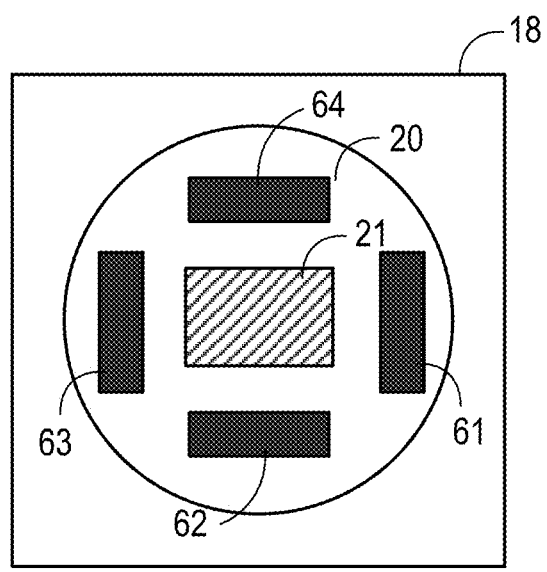
FIG. 6 illustrates a simplified top-down view of a template and actuating system for asymmetric shape modulation of the template according to an embodiment of the invention.

The asymmetric flexing or bowing of the template can be achieved by using an actuating system that can apply calibrated, localized forces to regions of the chucked template to induce such asymmetric flexing or bowing. Suitable actuating systems include, but are not limited to, pneumatic systems, piezoelectric actuators, and the like. Turning to FIG. 6, template 18 is shown with an actuator system according to one embodiment. Chucked template 18 includes circular recessed portion 20, with rectangular imprint field 21 centered relative to the recessed portion 20, and actuators 61, 62, 63 and 64 are positioned in proximity to the template chuck (not shown) and in superimposition with recessed portion 20 and surrounding imprint field 21. Actuators 61, 62, 63 and 64 are further positioned proximate to corresponding sides of imprint field 21. By locating actuators 61, 62, 63 and 64 proximate to but outside imprint field 21, a clear optical pathway to imprint field 21 is maintained allowing for transmission of actinic radiation for curing imprint fluid. Each of actuators 61, 62, 63 and 64 can be independently actuated, for example, by a controller (not shown), in order to supply a localized force against recessed portion 20. By varying which of actuators 61, 62, 63 and 64 are activated, either alone or in combination, template 18 can be asymmetrically bent or flexed into varying configurations.

Figure 7:
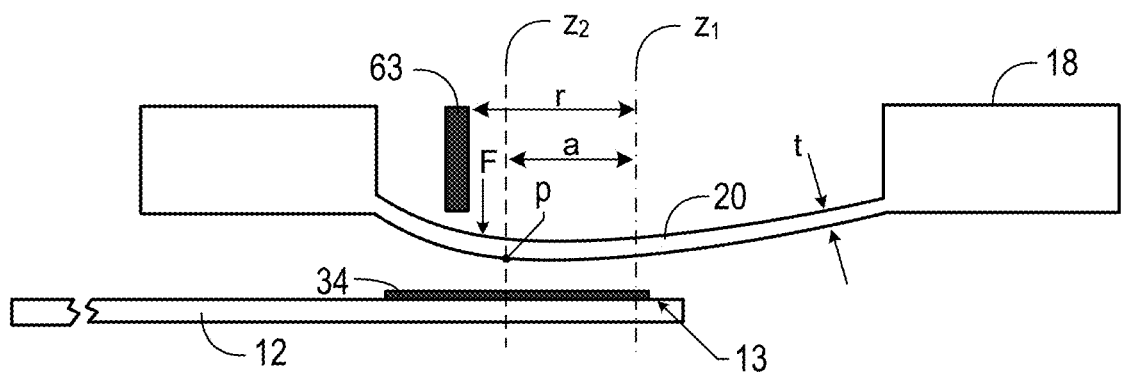
FIG. 7 is a simplified cross-sectional view of the template and an actuator of FIG. 6 with the template asymmetrically bowed toward a substrate.

The lowest or maximum deflected point on template 18 can be controlled by the magnitude of force applied by the actuating system and the locations of the applied force (or forces) and further depend on the material and thickness t of the template 18 at the recessed portion core-out in proximity to the imprint field. For example, FIG. 7 shows template 18 with recessed portion 20 in proximity to the imprint field having a thickness t. Actuator 63 located at distance 'r' from central axis $z_1$ of template 18 and applies force F to recessed portion 20 causing asymmetric deflection such that the lowest deflected point p is along axis $z_2$ and spaced apart a distance a from central axis $z_1$. Again, the actuators can be controlled by a controller (not shown) that is configured to actuate the actuators as described herein.

Figure 8:
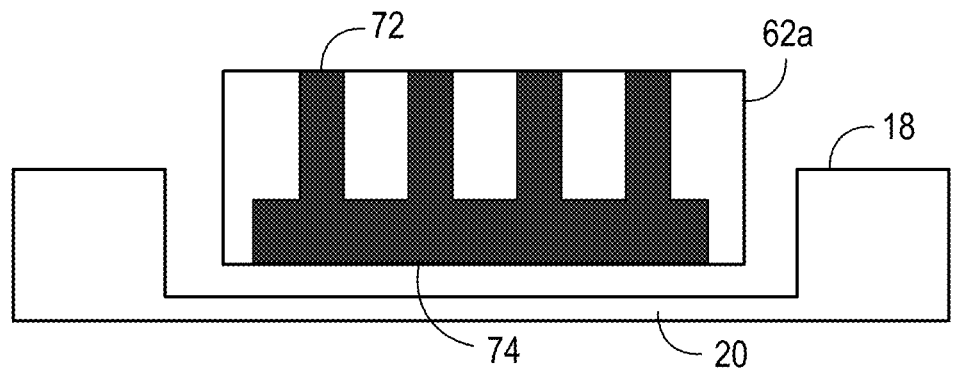
FIG. 8 illustrates a cross-sectional view of a template and an actuator according to another embodiment of the invention.

In certain variations, the actuating system can consist of actuators having pneumatic ports or slits positioned in close proximity to the backside of the template. In the embodiment of FIG. 8, actuator 62a includes pneumatic ports 72 in fluid communication with slit 74, with slit 74 opening to recessed portion 20 of template 18. The actuator is positioned at height h from recessed portion 20. The pneumatic ports are in fluid communication with a pressurized air or gas system (not shown). The addition of slit 74 helps make the pressure profile uniform over the length of actuator 62a. The magnitude of the actuating force that can be applied by actuator 62a to template recessed portion 20 can be controlled by varying height h and the input pressure P applied through ports 72.

Figure 9:
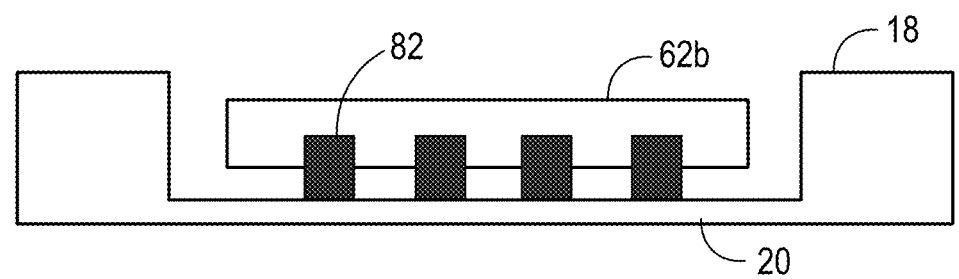
FIG. 9 illustrates a cross-sectional view of a template and an actuator according to yet another embodiment of the invention

Alternatively, the actuating system can utilize piezo actuators. In the embodiment of FIG. 9, actuator 62b includes an array of piezo actuators 82 positioned to contact the backside of recessed portion 20 of template 18. Asymmetric modulation of template 18 can be accomplished through selective activation of one or more piezo actuators 82, either alone or in combination with piezo actuators in additional actuators (not shown).

With reference to FIGS. 1 and 6, when imprinting partial fields, the size and location of the partial field on the wafer (i.e., its dimensions and coordinates) relative to the orientation of imprint field on the template 18 will dictate which of actuators 61, 62, 63, 65 may be activated and at what magnitude so as to control the initial point of contact between template 18 and imprint fluid 34 within the partial field. As the actuating magnitude of a given actuator is increased, the offset 'a' of deflection from the center of the imprint field is increased thereby ensuring that the template first touches imprint fluid inside the partial field being imprinted, as is further illustrated in FIG. 7.

Figure 10:
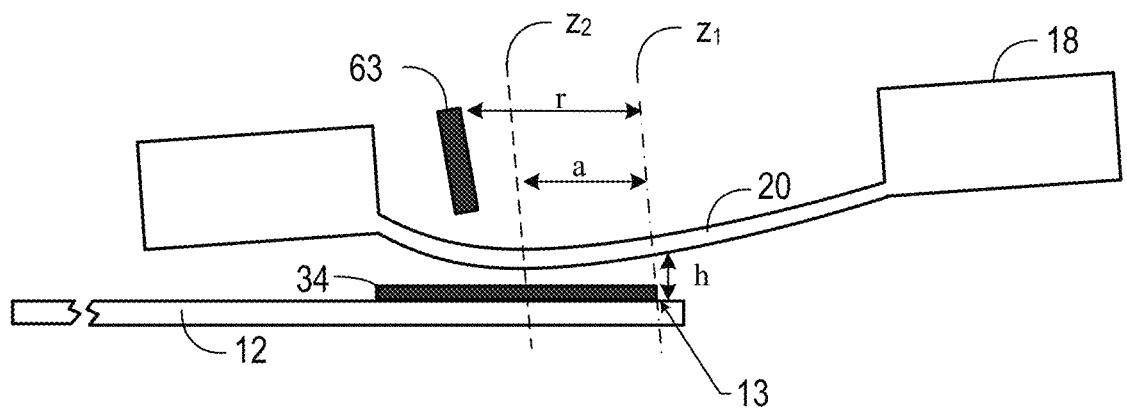
FIG. 10 illustrates a simplified cross-sectional view of the template and an actuator of FIG. 7 with the template tilted in relation to the substrate.

With asymmetric flexing or bowing of the template the point of initial contact can be controlled to fall within the partial fields being imprinted. Where the imprint fluid is deposited in drops, the contacted drops will spread and coalesce and a fluid front will spread from the initial point of contact outward towards the boundary of the imprint field. The spread velocity will be asymmetric due to the relative curvatures between the wafer and the template. Thus, in addition to asymmetric shape modulation described herein, the template can further be tilted relative to the wafer, as depicted in the embodiment of FIG. 10, in order to control the fluid spread velocity and to increase the distance or height h between the recessed portioned 20 of template 18 not in contact with imprint fluid 34 and wafer edge 13. Again, the increase in height h between template 18 and wafer 12 helps prevent damage to template 18 from physical contact with wafer 12.

Figure 11:
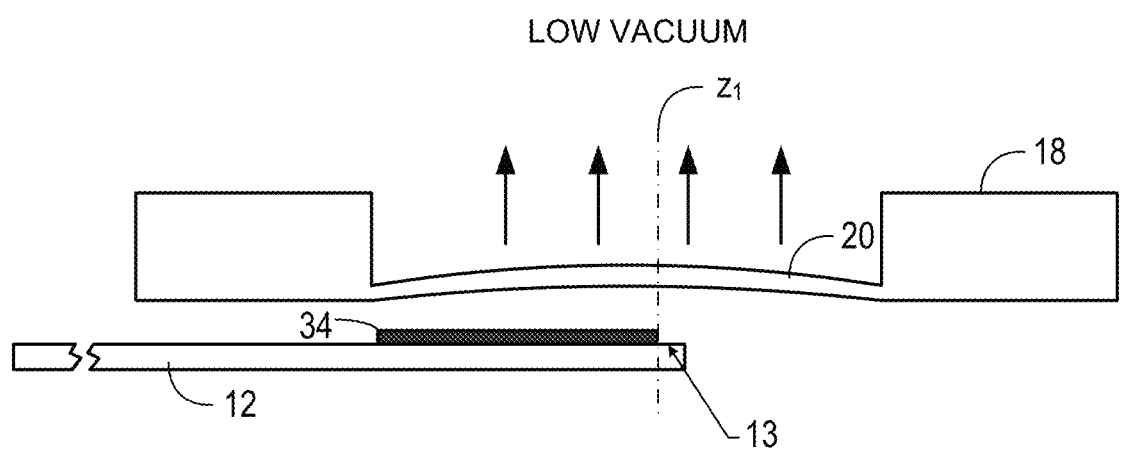
FIG. 11 illustrates a simplified cross-sectional view of a template symmetrically bowed away from a substrate at a partial field location according to a further embodiment of the invention.

Another approach to imprinting partial fields involves creating a concave profile of the template using controlled low vacuum on the back of the template. This ensures that when contacting the wafer the lowest points of the template are the four corners of the imprint field. The vacuum level used depends on the template mesa height, the core-out span and core-out thickness on the template. An embodiment of such an approach is depicted in FIG. 11. Recessed portion 20 of template 18, which contains the imprint field, is under controlled low vacuum pressure, creating a concave deflection of recessed portion 20 away from wafer 12, and importantly away from edge 13. Initial contact between the template 18 and imprint fluid is at the corners of the partial imprint field of recessed portion 20. As vacuum pressure on the back of recessed portion 20 of template 18 is relaxed, the deflection of recessed portion 20 is gradually reduced, enabling the fluid front to spread towards the center of the imprint field. This imprinting approach can also be combined with template tilting as previously described herein to increase the distance between template and wafer and to avoid template contact with the wafer.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A nanoimprint lithography system for imprinting a partial field of a substrate, the system comprising:
    a template chuck configured to retain an imprint lithography template, the template chuck having a central axis oriented normal to the template chuck and passing through the center of the template when retained thereon; and
    a plurality of actuators positioned in superimposition with a recessed portion of the template and at locations spaced apart from the central axis, each of said actuators capable of providing a force to the retained template to asymmetrically flex the recessed portion of the retained template away from the template chuck; and
    a controller configured to actuate the actuators in a manner to asymmetrically flex the recessed portion of the retained template away from the template chuck such that the maximum deflection of the recessed portion of the template occurs at a location spaced apart from the central axis
    wherein the retained template further includes an imprint field and wherein the actuators are further positioned so as to be disposed outside of the imprint field.

2. The nanoimprint system of claim 1 wherein the controller is further configured to control the magnitude of force applied by each actuator based on the coordinates and dimensions of a given partial field to be imprinted on a substrate.

3. The nanoimprint system of claim 1 wherein the controller is further configured to control the magnitude of force applied by each actuator based on the material and thickness of the retained template.

4. The nanoimprint lithography system of claim 1 wherein the template chuck is rotatable about an axis parallel to the retained template and normal to the central axis, thereby allowing the template chuck and the template retained thereon to tilt relative to a substrate disposed in superimposition with the template chuck and retained template.

5. The nanoimprint lithography system of claim 1 wherein the actuators comprise pneumatic ports or slits that provide pressurized air or gas as the actuating force.

6. The nanoimprint lithography system of claim 1 wherein the actuators are piezo actuators.

* * * * *